(12) United States Patent
Rumer et al.

(10) Patent No.: US 7,037,830 B1
(45) Date of Patent: May 2, 2006

(54) PVD DEPOSITION PROCESS FOR ENHANCED PROPERTIES OF METAL FILMS

(75) Inventors: Michael Rumer, Santa Clara, CA (US); Jack Griswold, San Jose, CA (US); Tom Dorsh, Santa Clara, CA (US); Michael Kwok Leung Ng, Daly City, CA (US); David E. Reedy, Fremont, CA (US); Paul D. Healey, Newton, MA (US); Michal Danek, Sunnyvale, CA (US); Reed W. Rosenberg, Gilroy, CA (US)

(73) Assignee: Novellus Systems, Inc., San Jose, CA (US)

(*) Notice: Subject to any disclaimer, the term of this patent is extended or adjusted under 35 U.S.C. 154(b) by 678 days.

(21) Appl. No.: 09/675,627

(22) Filed: Sep. 29, 2000

Related U.S. Application Data

(60) Provisional application No. 60/182,869, filed on Feb. 16, 2000.

(51) Int. Cl.
*H01L 21/441* (2006.01)
*H01L 21/445* (2006.01)
(52) U.S. Cl. ........................ 438/656; 438/683; 438/688
(58) Field of Classification Search ................ 438/643, 438/644, 648, 653, 656, 683, 687, 688
See application file for complete search history.

(56) References Cited

U.S. PATENT DOCUMENTS

| | | | | |
|---|---|---|---|---|
| 5,240,880 A | | 8/1993 | Hindman et al. ........... 437/200 |
| 5,242,860 A | | 9/1993 | Nulman et al. ............. 437/190 |
| 5,320,984 A | * | 6/1994 | Zhang et al. ............... 438/488 |
| 5,360,996 A | | 11/1994 | Nulman et al. ............. 257/767 |
| 5,427,665 A | * | 6/1995 | Hartig et al. ........... 204/192.12 |
| 5,434,044 A | | 7/1995 | Nulman et al. ............. 437/192 |
| 5,466,522 A | * | 11/1995 | Freeman et al. ............. 428/32 |
| 5,466,539 A | * | 11/1995 | Takayama ................... 428/611 |
| 5,473,456 A | * | 12/1995 | Cava et al. .................... 359/87 |
| 5,521,120 A | | 5/1996 | Nulman et al. ............. 437/190 |
| 5,738,917 A | | 4/1998 | Besser et al. ............... 427/576 |
| 5,741,721 A | * | 4/1998 | Stevens ...................... 438/396 |
| 5,821,680 A | * | 10/1998 | Sullivan et al. ............. 313/310 |
| 5,943,600 A | * | 8/1999 | Ngan et al. ................. 438/653 |
| 5,958,543 A | * | 9/1999 | Teng et al. ................ 428/65.3 |
| 5,972,178 A | | 10/1999 | Narasimhan et al. .... 204/192.7 |

(Continued)

*Primary Examiner*—Zandra V. Smith
*Assistant Examiner*—Pamela E Perkins
(74) *Attorney, Agent, or Firm*—Silicon Valley Patent Group LLP

(57) ABSTRACT

A physical vapor deposition sputtering process for enhancing the <0002> preferred orientation of a titanium layer uses hydrogen before or during the deposition process. Using the oriented titanium layer as a base layer for a titanium, titanium nitride, aluminum interconnect stack results in formation of an aluminum layer with predominant <111> crystallographic orientation which provides enhanced resistance to electromigration. In one process, a mixture of an inert gas, usually argon, and hydrogen is used as the sputtering gas for PVD deposition of titanium in place of pure argon. Alternatively, titanium is deposited in a two-step process in which an initial burst of hydrogen is introduced into the reaction chamber in a separate, first step. Pure argon is used as the sputtering gas for the titanium deposition in a second step. The method is broadly applicable to the deposition of metallization layers.

25 Claims, 3 Drawing Sheets

U.S. PATENT DOCUMENTS

| | | | |
|---|---|---|---|
| 6,063,703 A * | 5/2000 | Shinriki et al. | 438/653 |
| 6,083,830 A * | 7/2000 | Yamadai | 438/653 |
| 6,124,154 A * | 9/2000 | Miyasaka | 438/151 |
| 6,130,156 A * | 10/2000 | Havemann et al. | 438/637 |
| 6,139,922 A * | 10/2000 | Kaloyeros et al. | 427/576 |
| 6,143,191 A * | 11/2000 | Baum et al. | 216/63 |
| 6,165,861 A * | 12/2000 | Liu et al. | 438/382 |
| 6,277,726 B1 * | 8/2001 | Kitch et al. | 438/618 |
| 6,329,282 B1 * | 12/2001 | Hsu et al. | 438/625 |
| 6,440,843 B1 * | 8/2002 | Wada et al. | 438/635 |

\* cited by examiner

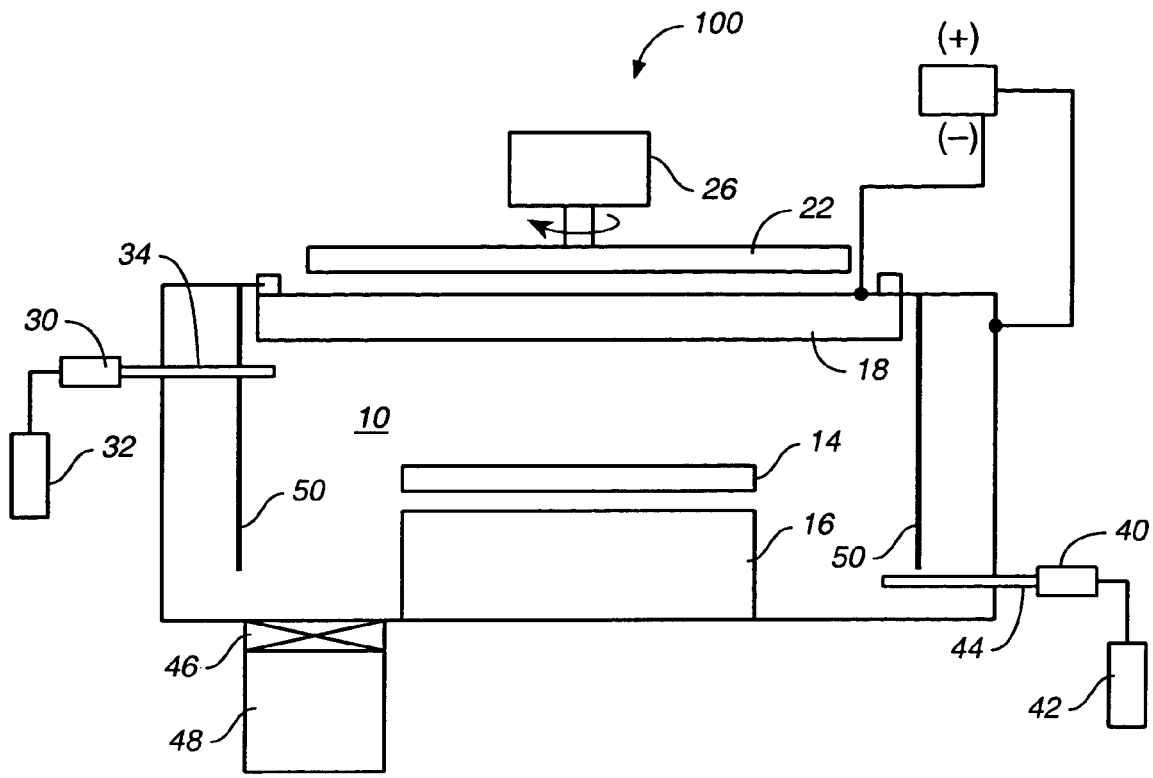
FIG._1
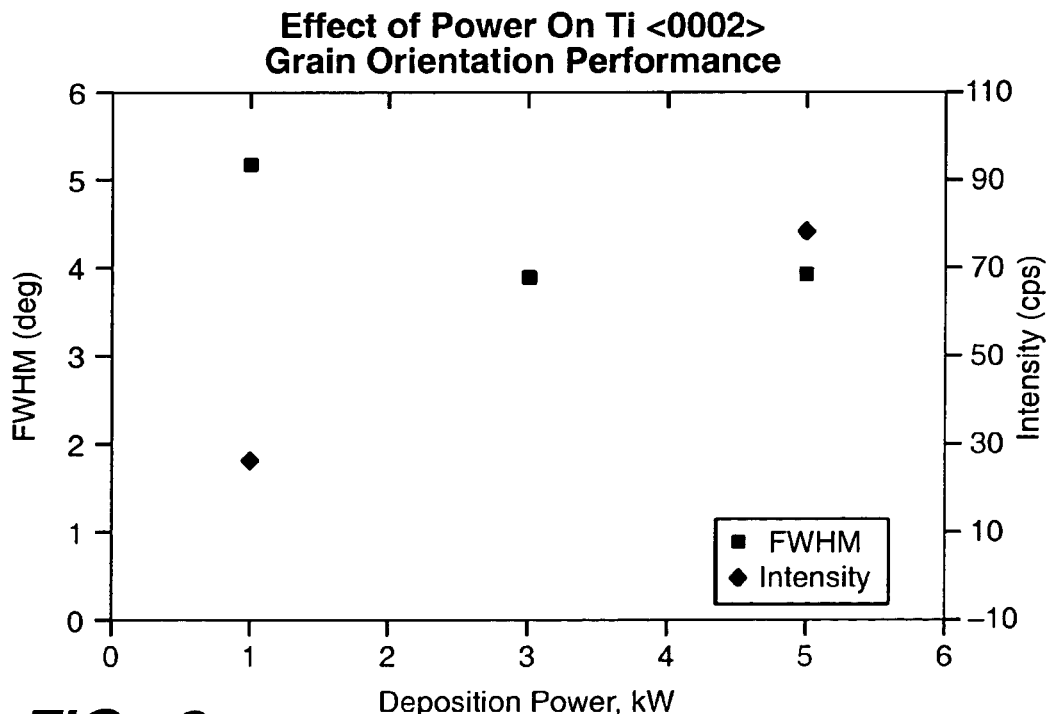
FIG._2

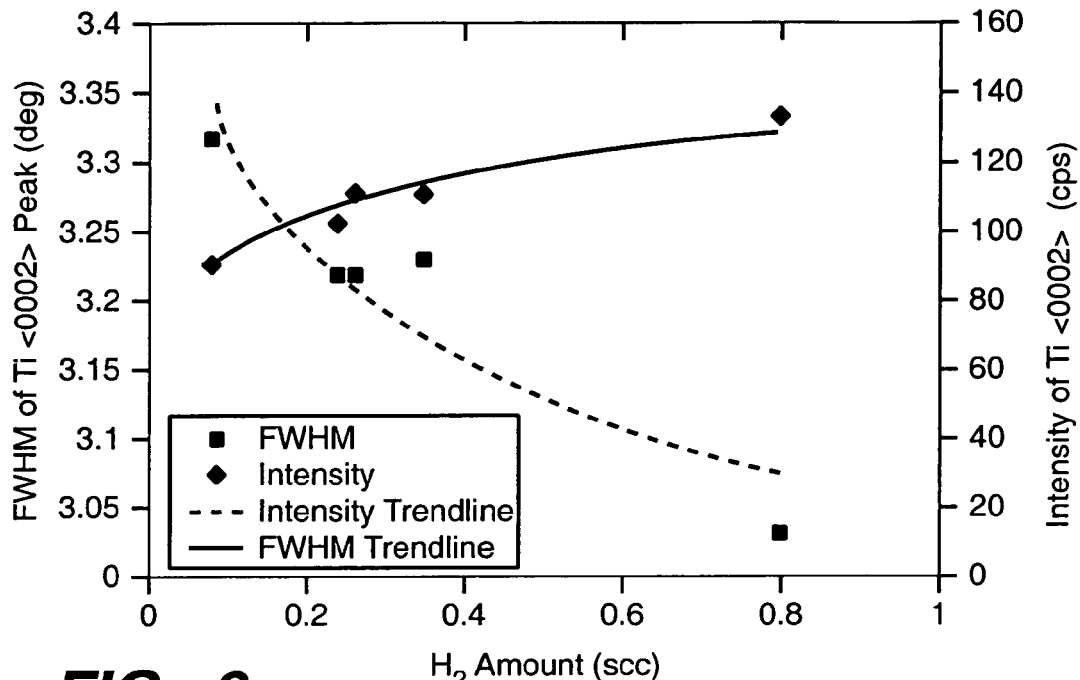
FIG._3
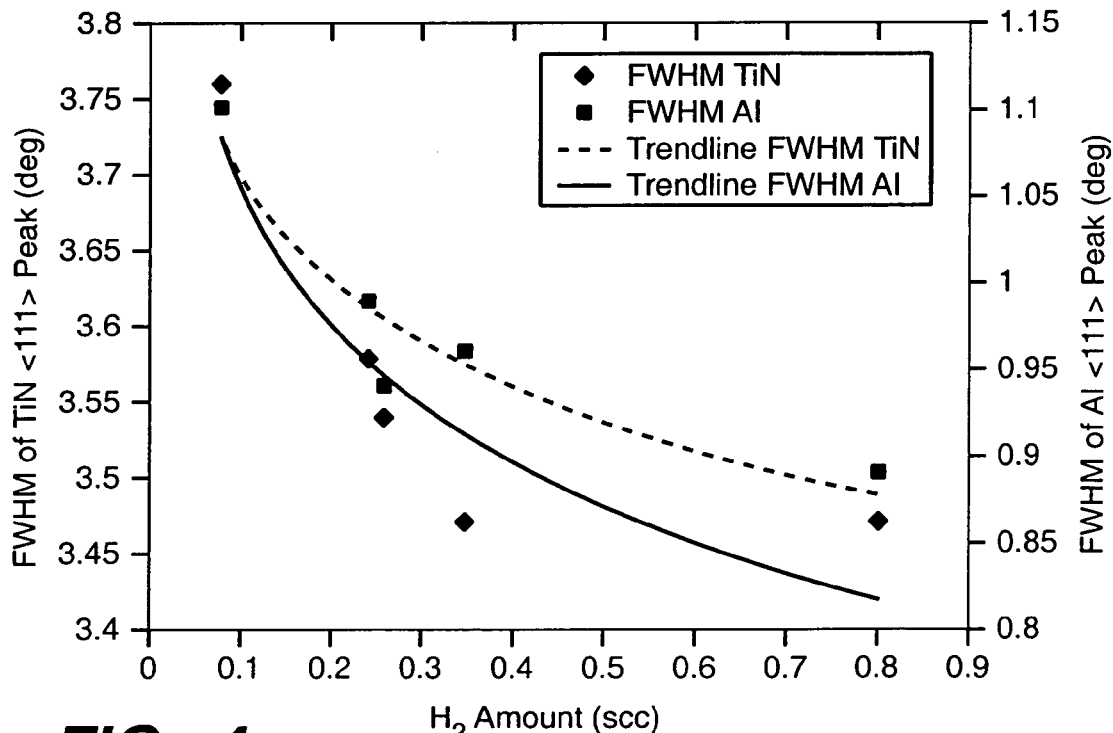
FIG._4

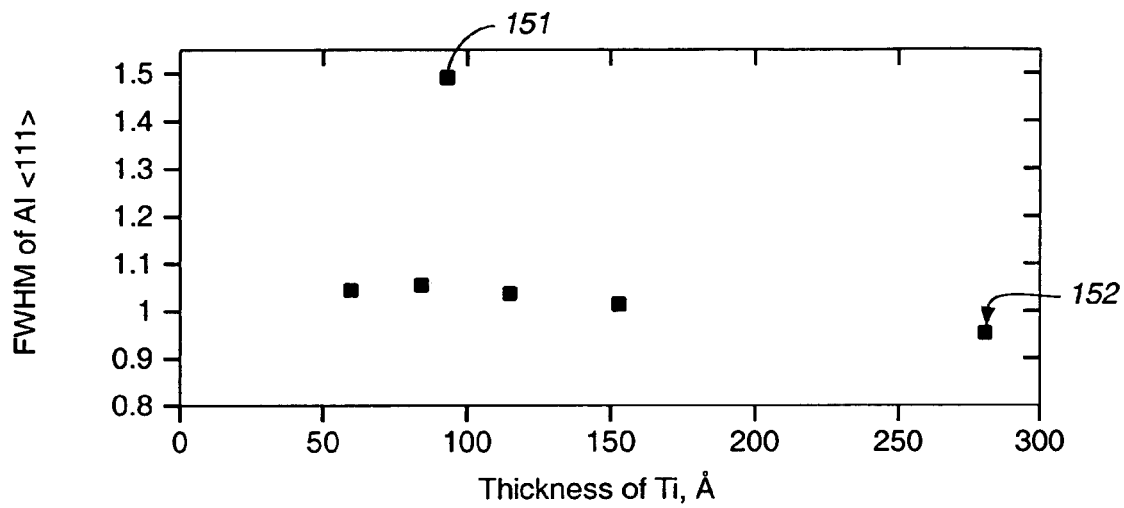
FIG._5a
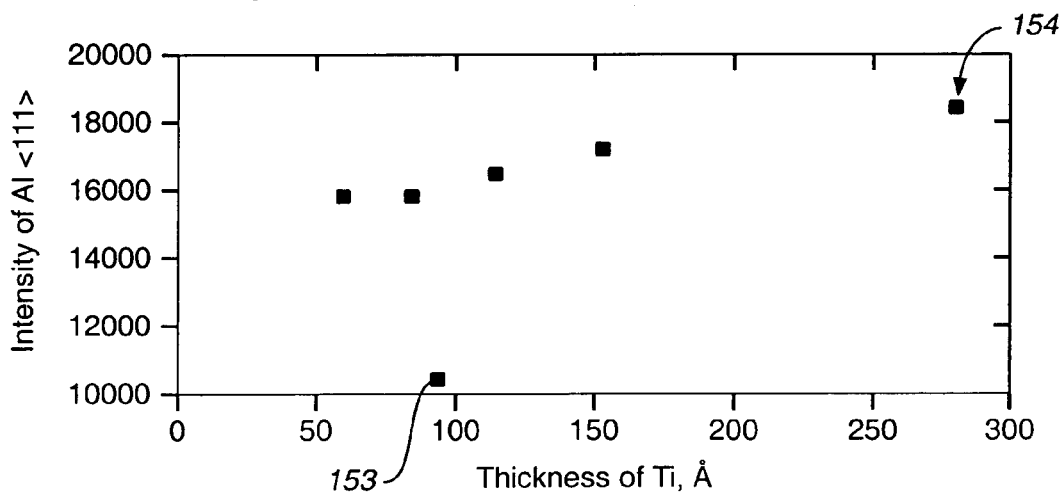
FIG._5b

PVD DEPOSITION PROCESS FOR ENHANCED PROPERTIES OF METAL FILMS

RELATED APPLICATION

This application claims the benefit of U.S. provisional application No. 60/182,869 filed on Feb. 16, 2000, the disclosure of which is incorporated herein by reference.

TECHNICAL FIELD

This invention relates generally to the fabrication of microelectronic devices, and more specifically to methods for physical vapor deposition sputtering of underlying layers for aluminum metal interconnects to provide improved aluminum film performance.

BACKGROUND

Microelectronic integrated circuits based on patterned semiconductor materials are continuing to evolve towards devices with an extremely high density of circuit elements per unit volume. As the features of these devices are reduced to smaller sizes, the performance of the materials that constitute the device will critically determine their success. Many integrated circuits (IC's) use aluminum, optionally including small amounts of other, alloying metals, as the conductor between the individual devices or structures that make up the circuit. It has been found that when aluminum is in direct contact with underlying silicon, so-called spiking, or migration of aluminum atoms into the silicon may occur which can interfere with the performance and reliability of the resulting IC device. Therefore typical aluminum interconnects include a layer of titanium over the silicon substrate, covered by a layer of titanium nitride and then the aluminum layer. The titanium nitride serves as a physical barrier to prevent migration of aluminum atoms into silicon and the titanium layer provides electrical connection to the underlying silicon substrate, tungsten plug, or aluminum layers. The stack may also include an additional TiN barrier layer over the aluminum conductor.

While the Ti/TiN/Al/TiN interconnect stacks have provided satisfactory results in the past, a key factor in meeting the enhanced performance requirements of improved devices is solving the problem of electromigration of aluminum atoms in the aluminum layer during operation of the device. Electromigration is directly related to the lifetime of the IC device. It is known that when the aluminum layer has a <111> crystallographic orientation, the electromigration problem is reduced. One approach to promoting formation of the aluminum layer in the desired <111> orientation is to form the TiN layer in a <111> crystallographic orientation. Methods for enhancing TiN <111> formation are described, for example, in a series of patents to Nulman et al. (U.S. Pat. Nos. 5,242,860, 5,360,996, 5,434,044, and 5,521,120). Further, it is known that enhancing the <0002> preferred orientation of the titanium underlayer promotes formation of the subsequently deposited TiN and Al layers in the desired <111> orientation and hence results in improved device performance. It would be desirable, therefore, to provide a deposition method that enhances the preferred orientation of a titanium film. It would further be desirable if the method is readily integrable with standard processes for deposition of aluminum interconnect stacks and is applicable to a variety of materials used in metallization layers.

SUMMARY

A physical vapor deposition process in which power is applied to a sputtering target under conditions where the atmosphere in the sputtering chamber includes hydrogen provides metal films with preferred crystal orientations. The hydrogen can be supplied before or during deposition. The process is applied to enhance the <0002> preferred orientation of a titanium layer. Using the oriented titanium layer as a base layer for a titanium, titanium nitride, aluminum interconnect stack results in formation of an aluminum layer with predominant <111> crystallographic orientation which provides enhanced resistance to electromigration. In addition, the process provides improvements in microstructural characteristics of the deposited layers for use as metallization layers in integrated circuit devices.

According to a first embodiment of the present invention, a gas containing hydrogen, most commonly a mixture of an inert gas, usually argon, and hydrogen is used as the sputtering gas for PVD deposition of titanium in place of pure argon. The argon and hydrogen may be provided separately to the sputtering chamber or they may be premixed. Typically hydrogen is supplied as a mixture with argon, for example as a molar percentage mixture of 1%, 2%, or 4% hydrogen in argon. Beneficial results are obtained when the amount of hydrogen in the sputtering chamber measured, by residual gas analysis, is at least a factor of 3 larger than the amount of hydrogen observed in the same chamber under the same process conditions when hydrogen is not introduced deliberately.

According to a second embodiment of the present invention, titanium is deposited in a two-step process in which hydrogen is introduced into the reaction chamber in a separate first step, termed an initial burst. In the two-step process, first an initial quantity of hydrogen is injected into the chamber. Typically, a mixture of hydrogen in argon is provided, although alternatively pure hydrogen or gaseous species containing hydrogen can be used. In the second step, the flow of the gas containing hydrogen is turned off and power is applied to the target and a flow of pure argon is turned on and used as the sputtering gas for the titanium deposition.

A direct correlation between the total amount of $H_2$ provided in the initial burst and the extent of Ti <0002> orientation has been observed. Furthermore, a correlation between preferential Ti <0002> orientation and preferential TiN <111> and Al <111> orientation has also been observed. Beneficial effects are obtained when the total amount of hydrogen provided in the initial burst for titanium deposition is at least $0.5 \times 10^{-4}$ standard cubic centimeters (scc) per $cm^2$ of target area.

In addition, aluminum layers deposited over titanium layers produced by the present process show larger nominal grain sizes and smaller grain size deviations than aluminum overlying conventionally deposited titanium. A higher degree of Al <111> crystalline orientation, tighter grain size distribution, and reduced surface roughness are expected to enhance electromigration properties.

Methods according to the present invention encompass physical vapor deposition processes generally in which a source of metal is sputtered or evaporated under conditions in which hydrogen is provided in a deposition chamber before and/or during deposition and energy is provided to activate the hydrogen before and/or during deposition. Further, the present methods are broadly applicable to the deposition of metallization layers.

BRIEF DESCRIPTION OF THE DRAWINGS

FIG. 1 is a schematic drawing of a physical vapor deposition apparatus in which embodiments of the present invention are practiced.

FIG. 2 presents plots of the full width at half maximum and peak intensity of a Ti <0002> X-ray diffraction signal as a function of deposition power for titanium layers deposited with an Ar/2% $H_2$ sputtering gas mixture, according to a first embodiment of the present invention.

FIG. 3 presents plots of the full width at half maximum and peak intensity of a Ti <0002> X-ray diffraction signal as a function of the total amount of hydrogen introduced in an initial hydrogen burst according to a second embodiment of the present invention.

FIG. 4 present plots of the full width at half maximum of TiN <111> and Al <111> X-ray diffraction signals as a function of the total amount of hydrogen introduced in an initial hydrogen burst according to the second embodiment of the present invention.

FIGS. 5a and 5b present plots of the full width at half maximum and peak intensity, respectively, of an Al <111> X-ray diffraction signal as a function of the thickness of a titanium underlayer where the titanium layer is deposited according to the initial hydrogen burst process.

DETAILED DESCRIPTION

A physical vapor deposition process (PVD) in which the atmosphere in a deposition chamber includes hydrogen provides metallization films with enhanced microstructure. In particular, introducing hydrogen before or during physical vapor deposition (PVD) of the titanium layer in a titanium, titanium nitride, aluminum (Ti/TiN/Al/TiN) interconnect stack results in a titanium layer with improved film morphology and a preferred <0002> orientation, using the hexagonal close packing notation appropriate for titanium. The oriented titanium layer, serves as a basis for formation of an oriented aluminum layer which is associated with enhanced electromigration performance. While the process is described below for deposition of a titanium layer, the process is broadly applicable to deposition of metallization layers containing aluminum, copper, or other materials.

PVD is typically performed in a cluster tool, which includes at least a separate module for each layer to be deposited. For example, to produce a Ti/TiN/Al/TiN interconnect stack, titanium is deposited in a first module, titanium nitride in a second, aluminum in a third, and the titanium nitride overlayer in a fourth module. Commercially available PVD cluster tools include the Inova®, provided by Novellus Systems, Inc. (San Jose, Calif.) and the Endura®, provided by Applied Materials (Santa Clara, Calif.). Standard PVD processes and equipment are described, for example, in Chapter 10 of "Silicon Processing for the VLSI Era Vol. 1" by Wolf and Tauber (Lattice Press, Sunset Beach, Calif., 1986).

Key components of a module 100 of an exemplary PVD system using a dc magnetron source are indicated schematically in FIG. 1. Target 18, a circular, planar block of material to be deposited, is spaced a distance d above wafer 14, which is mounted on a heating stage 16 in chamber 10. A dc power supply 20 is used to apply a dc field to target 18, establishing a plasma in the chamber below target 18. A circular magnet 22 mounted above the target is rotated by motor 26 setting up a magnetic field extending through target 18 into the region between the target 18 and wafer 14. Cryopump 48, connected to chamber 10 via valve 46 is used to evacuate the chamber. Process gas injector 44 is connected to process gas supply 42 via mass flow controller 40. Module 100 also includes a second process gas injector 34 which introduces process gases inside deposition shield 50 proximate to target 18. Process gas injector 34 is connected to process gas supply 32 via mass flow controller 30. A sputtering gas is introduced into chamber 10 via injectors 34, 44, or both. When power is applied to the target, electrons emitted from the target ionize the sputtering gas. Sputtering gas ions collide with the target, ejecting ions and atoms of the target material which are then deposited on the substrate. It is understood the detailed structure of module 100 is exemplary only. Processes according to the present invention could alternatively be practiced in other PVD reactors. For example, module 100 could use other deposition sources and processes such as an RF sputtering source, a dc sputtering source combined with an RF plasma, an evaporator source, or a hollow cathode magnetron plasma source, in place of the dc magnetron source. The hollow cathode magnetron plasma source produces a more highly ionized plasma than the dc magnetron source.

In a conventional process for the deposition of a titanium layer onto a substrate, target 18 is pure titanium. A substrate is introduced into a degas chamber and subjected to an elevated temperature for a certain period to drive off any residual contaminants adsorbed on the substrate, in a process termed in the industry, degassing. Then the substrate is transferred to a process chamber where a flow of a sputtering gas, typically an inert gas, and most typically argon, is introduced into the chamber, and power is applied to the target resulting in ejection of titanium atoms and ions from the target which are deposited onto the surface of the substrate forming a titanium layer. For example, in one process sequence, using an Inova® PVD cluster tool, for the initial degas step, the substrate is held at 350° C. for 45 seconds in the degas chamber. The process chamber is evacuated to about $5 \times 10^{-8}$ Torr, a typical base pressure for all sputtering processes in the chamber, prior to introduction of the substrate. Exemplary sputtering conditions are argon flow rate of between about 30 and about 80 standard cubic centimeters per minute (sccm), deposition pressure of about 3 to 4 mTorr, temperature of about 150° C., and process power of between about 1 and 5 kW, providing a power density of between about 1 and 5 W/cm².

According to a first embodiment of the present invention, a mixture of an inert gas, usually argon, and hydrogen is used as the sputtering gas for PVD deposition of titanium in place of pure argon. The argon and hydrogen may be provided separately to the chamber or they may be premixed. Alternatively, hydrogen may be provided in the form of a gaseous species containing hydrogen atoms. Typically hydrogen is supplied as a mixture with argon, for example as a molar percentage mixture of 1%, 2%, or 4% hydrogen in argon. A separate flow of argon mixed with hydrogen can be combined with a flow of pure argon to provide a desired ratio of hydrogen to argon in the sputtering gas. Other process conditions, such as flow rate and temperature are similar to the exemplary conditions above. Plasma power density of at least about 0.5 W/cm² and typically in the range of about 1 to 30 W/cm² is used. The upper end of the power density is constrained by the control of deposition time. Excellent results for thin films are obtained in the range of about 3 to 8 W/cm². In general, the power density provided by the process power needs to be sufficient to dissociate and/or ionize the hydrogen molecules in the process chamber or to dissociate and/or ionize a hydrogen-containing species.

After the titanium layer is deposited, layers of titanium nitride and of aluminum, optionally containing small addition of copper and/or silicon, are deposited using a conventional process with argon as the sputtering gas. In one example described below, a Ti/TiN/Al stack consisting of a 20 nm Ti layer, a 27 nm TiN layer, and a 630 nm Al layer was deposited. As used herein, an aluminum film is described as "overlying" a titanium film independent of whether or not an intervening film, such as TiN, is present in the stack. The titanium film and the overlying aluminum film are characterized by the width and peak intensity of the X-ray diffraction peak of their <0002> and <111> crystal orientations, respectively, average grain sizes, and grain size variations. Use of hydrogen, along with argon, as the sputtering gas for the titanium layer results in enhancement of the preferred <0002> orientation of the titanium layer as well as the elimination of other titanium orientations. The enhanced <0002> orientation is evidenced by increased peak intensity and decreased full width at half maximum (FWHM) of the <0002> X-ray diffraction peaks as compared with the corresponding values for titanium deposited without hydrogen. Furthermore, the increase in the degree of Ti <0002> orientation is correlated with enhancement of the <111> orientation of the overlying Al layer, as evidenced by increased peak intensity and decreased FW of the Al <111> x-ray diffraction peak, and by increased Al average grain sizes and decreased Al grain size variation. In particular, a reduction in FWHM of the Al <11> peak of over 35%, with respect to a sputtering process in pure argon, has been achieved. All of these improved Al film properties, increased <111> orientation, larger grain size and smaller grain size variation are major contributors to improved electromigration performance.

Without being bound to any theory of operation, the inventors suggest the beneficial result of introducing hydrogen can be attributed to removing contaminants from the surface of the substrate. Despite the usual precautions taken in semiconductor fabrication: evacuating the chamber, for example, to less than $10^{-7}$ Torr, prior to deposition, and using high purity, VLSI grade process gases, a low level of residual contamination due to leaks in the vacuum system, and introduced by the target, substrate, or process gases cannot be avoided. The term residual is used to refer to any species other than titanium, argon, or hydrogen. The higher the level of residual contaminant gases in the chamber, the higher the level of contaminants adsorbed on the substrate surface. Molecular hydrogen introduced into the reaction chamber is dissociated in the plasma to highly reactive atomic hydrogen atoms and ions which react with residual adsorbed species on the surface of the substrate, for example with adsorbed $O_2$ or $N_2$. This reaction minimizes the reaction of incoming Ti atoms with adsorbed species, which would prevent surface diffusion of Ti adatoms. Consequently, the mobility of the Ti adatoms is enhanced, allowing Ti to preferentially grow into lower stressed grains with an <0002> orientation.

It has been demonstrated that higher process power results in better Ti <0002> orientation. The power dependence observation is consistent with the interpretation that hydrogen reduces residuals on the surface of the substrate in the PVD chamber. Higher power increases the Ti atom arrival rate and shortens the deposition time. Thus, at a given residual background gas level, higher power leads to fewer residuals being incorporated in the film and consequently better Ti <0002> orientation. The <0002> Ti orientation is then utilized by both the TiN <111> film and the Al <111> film grain growth. Titanium films deposited without the enhancement from using hydrogen in the deposition process, include several different orientations. Randomly oriented Ti films or films with weak <0002> orientations do not promote growth of either the preferred <111> TiN nor the <111> Al orientation.

According to a second embodiment of the present invention, titanium is deposited in a two-step process in which hydrogen is introduced into the reaction chamber in a separate first step. According to the two-step process, first an initial quantity of hydrogen is injected into the chamber. As described herein, the initial quantity of hydrogen is referred to as a hydrogen "burst" which, however, is not meant to imply anything about the rate at which hydrogen is provided in the first step. Typically, a mixture of hydrogen in argon is provided although the alternatives discussed above in the one-step process can be used. In the second step, the flow of the gas containing hydrogen is turned off and a flow of pure argon is turned on and used as the sputtering gas for the titanium deposition.

In the Inova® PVD cluster tool, for example, an initial burst of hydrogen is provided by flowing a mixture of hydrogen in argon into the chamber. For example, a 1%, 2%, or 4% mixture of hydrogen in argon is provided at a flow rate between about 50 and 250 sccm for a period of about 5 to 100 seconds, resulting in a partial pressure of hydrogen in the chamber in the range of about $3$–$10 \times 10^{-5}$ Torr before the deposition of titanium. As explained below, for greater effectiveness, the $Ar/H_2$ mixture is introduced via an injector positioned in close proximity to the target, such as injector 34 in FIG. 1, which typically is located within about 2 cm of target 18. In the second, sputtering step, pure argon sputtering gas is introduced, typically through injector 44, at a flow rate between about 50 and 80 sccm. As depicted in FIG. 1, injector 44 is located in a substantially different position than injector 34; however, alternatively, injector 44 may be located in any position in the chamber. The process power for the titanium deposition is at least about 0.5 W/cm² as described above for the one step process.

A direct correlation between the total amount of $H_2$ provided in the initial burst and the extent of Ti <0002> orientation has been observed. As shown in FIG. 3 and Example 3 below, the FWHM of the Ti <0002> X-ray diffraction peak decreases and the peak intensity increases as the total amount of hydrogen provided in the initial burst increases. The total amount of hydrogen is determined by the product of the percentage of hydrogen in the $Ar/H_2$ gas mixture, the flow rate of the $Ar/H_2$ gas mixture, and the flow duration. As described further below, the amount of hydrogen provided in the burst process to achieve the benefits of the present two step deposition process depends most strongly on the target size. The results of FIG. 3 were obtained with a 1001 cm² target. The data of FIG. 3 demonstrate beneficial effects are obtained when the total amount of $H_2$ provided in the initial burst is at least $1 \times 10^{-4}$ standard cubic centimeters (scc) per cm² of target area. Further, the effects according to the present process may be obtained with an initial burst of at least $0.5 \times 10^{-4}$ scc per cm² of target area.

Furthermore, increased Ti <0002> orientation also correlates with improved TiN<111> and Al <111> orientation as reported above for the first process in which $H_2$ is provided during deposition. X-ray diffraction peaks of Al <111> in Ti/TiN/Al stacks in which the Ti layer was deposited by the present initial hydrogen burst process with FWHM values between 0.9 and 1.15° have been obtained. In comparison, the corresponding FWHM of an Al <111> layer in a stack in which the titanium layer was deposited conventionally is about 2.0°. Film roughness and grain size distribution of the Al layer were measured by atomic force microscopy. Aluminum overlying a titanium layer deposited by the present initial burst process has a larger nominal grain size and smaller grain size deviation than aluminum overlying conventionally deposited titanium. A higher degree of Al <111> crystalline orientation and tighter grain size distribution are both expected to enhance electromigration properties. Thus, a titanium underlayer deposited by the two step titanium process in which a mixture of Ar and $H_2$ is provided in an initial burst leads to Ti/TiN/Al stacks in which the aluminum layer has improved film properties.

The effect of the thickness of the underlying titanium layer deposited by the present process on the orientation of an aluminum layer directly over the titanium layer was also investigated. For Ti layers between about 6 and 30 nm, the X-ray diffraction FWHM of an overlying Al <111> layer varied by less than 15% between about 0.95 and 1.08, while the corresponding value for Al over conventional titanium is about 1.5 or greater. Thus, the benefits of <0002> oriented titanium providing an oriented Al <111> layer can be achieved with titanium layer thicknesses less than 10 nm, as thin as about 6 nm. A reduced titanium layer reduces the amount of highly resistive $TiAl_3$ formed at a Ti/Al interface during subsequent annealing.

Further, the effect of TiN layers deposited by different processes between a Ti layer formed by the initial burst process and a top Al layer were compared. Both 30 and 60 nm thick TiN layers were formed by reactive sputtering of Ti in pure $N_2$ and in an $Ar/N_2$ mixture. While the X-ray diffraction results indicated TiN layers deposited with an $Ar/N_2$ gas mixture had somewhat better TiN <111> orientation, the Al <111> orientation for the Al layer over all of the TiN samples exhibited excellent performance. Thus, it can be concluded that the deposition process and thickness of the TiN layer in a Ti/TiN/Al stack plays a secondary role in the formation of Al grain structure. The critical factor affecting Al layer orientation is the character of the Ti layer.

Finally, it may be noted the two-step process, in which hydrogen is used only before deposition has the beneficial effect of limiting the amount of hydrogen incorporated in the Ti film. Hydrogen incorporated in Ti could migrate into the aluminum film during subsequent annealing processing, which is known to be associated with problems of stress and film void formation.

In general, in order to achieve the beneficial effects of the processes according to the present invention, the amount of hydrogen available in the chamber during deposition needs to be in excess of the number of residual species. Measurements of hydrogen partial pressures in an Inova® PVD reactor by a closed source Residual Gas Analyzer (RGA), (Spectra International, Morgan Hill, Calif.), positioned near a baffle to the cryopump, show good results are obtained when the measured amount of hydrogen is at least a factor of 3 larger than the amount of hydrogen observed in the same chamber under the same process conditions when hydrogen is not introduced deliberately. As shown in Example 1 below, for the one step process, an effective hydrogen concentration was obtained when the percentage of hydrogen in the argon/hydrogen sputtering gas used for the deposition of titanium was 0.25%. Engineering estimates indicate that for the one step process, a concentration of at least 0.1% hydrogen in the sputtering gas will enhance the preferred titanium orientation.

With respect to the two-step process, again without being bound by theory, the inventors believe the mechanism for titanium deposition may be understood from the well-known propensity of pure titanium to getter, that is absorb, hydrogen. During the first step, the target absorbs hydrogen from the $Ar/H_2$ mixture. From observations of the time to establish a steady state partial pressure of hydrogen in the reaction chamber, it is estimated that available sites in the Ti target to a depth of about 50 Å are saturated with hydrogen. When the deposition plasma is ignited, the hydrogen is released and activated, producing high concentration of H atoms and H+ ions which react with adsorbed species on the surface of the substrate as explained above. Injecting the $Ar/H_2$ gas mixture near the target, promotes rapid saturation of the target with hydrogen. Use of high power density during Ti deposition, preferably 3 to 5 $W/cm^2$, enhances the concentration of H+ ions. The flow rate and duration of the $Ar/H_2$ gas mixture sufficient to saturate the Ti target with hydrogen depend on the size of the target and pumping speed of the cryopump. For example, an estimated $3 \times 10^{18}$ hydrogen molecules are adsorbed by a Ti target of 1000 $cm^2$ surface area, at saturation to a depth of about 50 Å. At a pumping speed of 400 liters/second, a 200 sccm flow of Ar/1% $H_2$ for 10 seconds provides an estimated $9 \times 10^{18}$ hydrogen molecules to the reaction chamber. From the above considerations, those skilled in the art can easily determine effective operating conditions for other target sizes, cryopump speeds and hydrogen concentrations for the deposition of titanium. When the present methods are applied to deposition of metals other than titanium, the propensity of the target material to getter hydrogen will also need to be taken into account.

The features and benefits of the present methods of enhancing crystal orientation and microstructure of metallization layers are further illustrated in the following examples which are offered by way of illustration, but not of limitation.

EXAMPLE 1

Steady State $H_2$ Partial Pressure During Ti Deposition

Ti/TiN/Al(0.5% Cu) stacks were deposited on oxidized silicon substrates in an Inova® PVD cluster tool. VLSI grade Ar (99.999% pure) and VLSI grade (99.999% pure) Ar/1% $H_2$ (Air Products and Chemicals, Inc., Allentown, Pa.) were used for the Ti sputtering deposition in the ratios listed below in Table 1. Process conditions for the Ti, TiN, and Al depositions are given in Table 2. Before deposition of the Ti layer, the substrate was heated to 350° C. for 45 seconds. A 20 sec cooling step in which 35 sccm of Ar was flowed over the stack inside a cooling chamber followed deposition of the Al layer. Total chamber pressure was measured using an MKS Baratron™ capacitance manometer. Relative partial pressures of gases in the deposition chamber were measured with a Spectra™ quadrupole residual gas analyzer (RGA).

Table 1. Process Gases for Ti Deposition

TABLE 1

Process Gases for Ti Deposition

| | Ar/1% $H_2$ Flow rate (sccm) | Ar Flow rate (sccm) | % $H_2$ |
|---|---|---|---|
| Sample A (Comparison) | 0 | 55 | 0 |
| Sample B | 14 | 41 | 0.25 |
| Sample C | 36 | 19 | 0.65 |
| Sample D | 55 | 0 | 1.0 |

Table 2. PVD Process Conditions

TABLE 2

PVD Process Conditions

|  | Ti | TiN | Al(0.5% Cu) |
|---|---|---|---|
| Process gas flow rate (sccm) | See Table 1 | Ar 55 N$_2$ 80 | Ar 35 |
| Process time (sec) | 9.8 | 14.2 | 32.1 |
| Process power (kW) | 3 | 10 | 17 |
| Temperature (° C.) | 150 | 250 | 300 |
| Layer Thickness (nm) | 20 | 27 | 630 |

X-ray diffraction measurements of the films on Samples A–D and in all following examples were obtained with a Siemens D500 diffractometer with 0.1° beam divergence, operated at 44 kV and 27 mA. The intensity of the <111> crystallographic orientation was characterized by the full width at half maximum, denoted FWHM, and area under the <111> signal versus incident angle, denoted $I_1$, (rocking curve measurement). Values for Samples A–D are listed in Table 3. Also listed are the average grain size, S, and standard deviation of the grain size, σ, of the Al film, obtained by measurement of atomic force microscopy images.

X-ray diffraction data and grain size information were combined to estimate the electromigration performance of an Al line deposited according to the method of Samples A–D. The empirical formula of Vaidya et al., Proceedings of the 18$^{th}$ Annual Reliablity Symposium, IEEE, p. 165 (1980)

$$MTF=(S/\sigma^2)\log(I_{111}/I_{200})^3 \quad (1)$$

where MTF is the relative mean time to failure, and $I_{200}$ is the background noise level at the position of the <200> peak, is used. The MTF results have been normalized to a value of 1 for the comparison Sample A with no hydrogen.

Table 3. Al <111> Results

TABLE 3

Al <111> Results

|  | FWHM (°) | $I_{111}$ (cps) | S | σ | Relative MTF |
|---|---|---|---|---|---|
| Sample A (Comparison) | 1.91 | 7721 | 9.3 | 10.6 | 1 |
| Sample B | 1.44 | 12553 |  |  |  |
| Sample C | 1.29 | 12649 |  |  |  |
| Sample D | 1.17 | 14467 | 11.77 | 7.1 | 3.4 |

As can be seen in Table 3, use of hydrogen during deposition results in an enhanced Al <111> orientation as evidenced by narrower <111> x-ray diffraction peaks with higher intensity as the percentage of hydrogen used in the sputtering gas is increased. Furthermore, the present process results in larger grain sizes with smaller variation, all of which are expected to lead to a longer mean time to failure, according to the empirical formula (1). With 1% hydrogen in the sputtering gas, the mean time to failure is estimated to be more than three times longer than for a film deposited without hydrogen.

EXAMPLE 2

Effect of Plasma Power on Ti <0002> Orientation

Titanium films of thickness approximately 28 nm were deposited on oxidized silicon substrates using an Ar/2% H$_2$ sputtering gas mixture, according to the process parameters given below in Table 4.

Table 4. Effect of Power on Ti Grain Orientation

TABLE 4

Effect of Power on Ti grain orientation

| Process Parameter |  |  |  |
|---|---|---|---|
| Chuck temperature set point, ° C. | 150 | 150 | 150 |
| Ar/2% H$_2$ flow (sccm) | 77 | 77 | 77 |
| Power, kW | 1 | 3 | 5 |
| Deposition Time, sec | 29 | 10 | 5.3 |
| Thickness (nm) | 30 | 27.5 | 28.5 |

Titanium thickness reported in Table 4 was measured using a Kevex Omicron X-Ray fluorescence (XRF) device. The FWHM and intensity of the resulting Ti <0002> X-ray diffraction peaks are shown in FIG. 2. It can be seen that higher power helps to produce better Ti grain orientation. As discussed above higher power accelerates the Ti arrival rate at the substrate resulting in incorporation of fewer residuals in the Ti film. Higher power also increases the extent of hydrogen activation. In this experiment, the base pressure in the chamber prior to deposition was about 6×10$^{-9}$, which is low by industrial standards. The example therefore demonstrates that even at a low base pressure, Ti film performance can be affected by residual gas levels.

EXAMPLE 3

Initial Hydrogen Burst (Two-Step) Ti Deposition

Titanium layers were deposited on silicon substrates in an Inova® PVD cluster tool. In the first step Ar/1% H$_2$ VLSI grade (Air Products and Chemicals, Inc., Allentown, Pa.) was introduced into the chamber through a gas injector located adjacent the target. The Ar/H$_2$ flow rate varied from 77 to 240 sccm and the Ar/H$_2$ duration varied from 60 to 20 seconds. Process temperature was 150° C. The area of the titanium target was 1001 cm$^2$. Immediately after completion of the initial burst, pure Ar at a flow rate of 77 sccm was introduced into the chamber and the plasma ignited at a 5 kW power level. Deposition time was 4.9 sec. Thickness of deposited films, measured by XRF as described above was 27.5 nm.

The FWHM and intensity of the resulting Ti <0002> X-ray diffraction peaks are shown in FIG. 3 as a function of the product of Ar/H$_2$ flow rate and duration. Ti grain orientation can be seen to correlate with the flow rate and duration product, which corresponds to total amount of hydrogen introduced in the initial burst.

EXAMPLE 4

Orientation of TiN and Al Films Overlying Ti Films Deposited with Initial Hydrogen Burst Ti films deposited as described in Example 3 were moved to another PVD chamber in-situ, remaining under vacuum, for sputter deposition of a TiN film according to the process parameters listed in Table 5 below. After TiN deposition, the wafers were moved to another PVD chamber for Al deposition, according to the process also listed in Table 5.

Table 5. Process Parameters for TiN and Al Deposition

TABLE 5

Process parameters for TiN and Al deposition

| Process Parameters | TiN | Al |
|---|---|---|
| Chuck temperature set point (° C.) | 250 | 300 |
| Source-to-Substrate Spacing (mm) | 73 | 62 |
| Power (kW) | 10 | 17 |
| Deposition Time (sec) | 16 | 30 |
| Ar flow (sccm) | 55 | 35 |
| $N_2$ flow (sccm) | 80 | NA |
| Monitor Thickness (nm) | 27.5 | 600 |

All of the samples showed highly textured films with Al<111>/Ti<0002> orientation along the direction normal to the surface. No Ti peaks of orientations other than <0002> were detected in any of the samples. The FWHM of the TiN <111> peak is plotted versus the left vertical axis in FIG. 4 while the FWHM of the Al <111> peak is plotted versus the right vertical axis in FIG. 4 as a function of the product of AR/$H_2$ flow rate and duration during the initial burst of the underlying Ti deposition process. The TiN and Al peaks exhibit the same correlation with amount of $H_2$ released in the initial burst as shown by the Ti X-ray diffraction data in FIG. 3. The results of FIG. 4 demonstrate the beneficial effect of improved Ti <0002> orientation on the resulting TiN <111> and Al <111> orientations.

EXAMPLE 5

AFM Analysis of Al Films Overlying Ti Films Deposited with Initial Hydrogen Burst Ti/(20 nm)/TiN(27 nm)/Al (0.5% Cu)(630 nm) film stacks were deposited in an Inova® PVD cluster tool according to the process recipes for Ti deposition given below in Table 6. Samples E and F were deposited with an initial hydrogen burst, while Sample G is the comparison sample, deposited conventionally. The TiN and Al layers were deposited according to the process of Table 5 above.

Table 6. Process Parameters for Ti Layer

TABLE 6

Process parameters for Ti layer

|  | Sample E | Sample F | Sample G Comparison |
|---|---|---|---|
| Ar/4% $H_2$ burst flow rate (sccm) | 77 | 77 | none |
| Ar/4% $H_2$ burst duration (sec) | 10 | 10 | none |
| Ti deposition sputtering gas flow, deposition time | Ar 77 sccm, 4.9 sec | Ar 77 sccm, 9.8 sec | Ar 77 sccm, 9.8 sec |
| Ti deposition power (kW) | 5 | 3 | 3 |

Atomic force microscopic analysis of the aluminum layer indicated the aluminum layers overlying titanium layers deposited with an initial hydrogen burst, Samples E and F, had a smoother surface and larger nominal grain size, compared with the conventional Ti layer, deposited with Ar as the sputtering gas.

Table 7. AFM Analysis of Al Layer

TABLE 7

AFM analysis of Al layer

|  | RMS Roughness* (nm) | ASTM Nominal Grain Size (μm) | ASTM Nominal Standard Deviation |
|---|---|---|---|
| Sample E | 2.765 | 0.611 | 0.066 |
| Sample F | 2.705 | 0.659 | 0.102 |
| Sample G | 3.003 | 0.530 | 0.106 |

*Standard deviation of Z values (height of individual points) in the image

*Standard deviation of Z values (height of individual points) in the image

EXAMPLE 6

Effect of Thickness of Ti Layer on Performance of Al Films

Titanium films of varying thicknesses between 6 and 28 nm were deposited on oxidized silicon wafers using an initial burst of Ar/2% $H_2$ at 160 sccm for 20 seconds. The titanium layers were deposited at 5 kW process power with Ar as the sputtering gas at 77 sccm. A 9 nm thick comparison film of Ti was deposited without an initial hydrogen burst. Al layers were deposited directly over the Ti layers without vacuum break using the process as listed in Table 5. The FWHM and intensity of the Al <111> X-ray diffraction peak are shown in FIGS. 5a and 5b, respectively, as a function of Ti thickness. The points labeled 151 and 153 are due to the comparison Ti layer, deposited without hydrogen while the line of points labeled 152 and 154 show the results for Ti layers deposited with the initial Ar/2% $H_2$ burst. The benefits of the present process, higher intensity, narrower Al <111> peaks are obtained for Ti layers deposited with the burst process, in the entire range of thickness shown in FIGS. 5a and 5b.

EXAMPLE 7

Effect of Intermediate TiN Layer on Performance of Al Films

Ti/TiN/Al stacks were prepared varying the TiN deposition process as indicated in Table 8. Samples H and J used a mixture of Ar and $N_2$ as the sputtering gas while Samples I and K were deposited using pure $N_2$. The Ti and Al layers were deposited as in Example 6.

Table 8. TiN Deposition Process

TABLE 8

TiN Deposition Process

|  | Sample H | Sample I | Sample J | Sample K |
|---|---|---|---|---|
| Chuck temperature (° C.) | 250 | 250 | 250 | 250 |
| Source-to-Substrate Spacing (mm) | 73 | 73 | 73 | 73 |
| Power (kW) | 10 | 10 | 10 | 10 |
| Deposition time (sec) | 17 | 17 | 34 | 34 |
| Cool time (sec) | 17 | 17 | 0 | 0 |
| Argon flow (sccm) | 55 | 0 | 55 | 0 |
| Nitrogen flow (sccm) | 80 | 100 | 80 | 100 |
| TiN thickness (nm) | 30 | 30 | 60 | 60 |

FWHM and peak intensity of the X-ray diffraction peaks for the TiN <111> and the Al <111> layers are listed below in Table 9.

Table 9. FWHM of TiN <11> and Al <111> Layers

TABLE 9

FWHM of TiN <111> and Al <111> layers

|  | TiN FWHM (°) | TiN $I_{111}$ (cps) | Al FWHM (°) | Al $I_{111}$ (cps) |
|---|---|---|---|---|
| Sample H | 5.42 | 24.7 | 1.02 | 17417 |
| Sample I | 7.29 | 8.2 | 1.15 | 14331 |
| Sample J | 5.57 | 52.3 | 1.04 | 16574 |
| Sample K | 7.35 | 17.2 | 1.09 | 15882 |

While the TiN layers deposited with the Ar/N$_2$ sputtering gas mixture had somewhat narrower TiN and Al X-ray diffraction peaks with higher peak intensities, the Al X-ray diffraction results indicate that all of the TiN layers led to Al layers with excellent <111> orientations.

Although the present invention has been described in terms of specific examples, the description is only an example of the invention's application. Various adaptations and modifications of the processes disclosed are contemplated within the scope of the invention as defined by the following claims.

We claim:

1. A method of forming a titanium layer on a substrate, the method comprising:
    placing the substrate in a deposition chamber comprising a titanium sputtering target; and
    after placing the substrate in the deposition chamber, introducing a quantity of hydrogen into the deposition chamber without providing power to the titanium sputtering target; and
    sputter depositing the titanium target onto the substrate by physical vapor deposition of the titanium sputtering target by applying power to the titanium sputtering target under conditions wherein the atmosphere in the deposition chamber comprises hydrogen and wherein the hydrogen is activated, whereby the titanium layer has a preferred crystal orientation.

2. The method of claim 1 wherein introducing a quantity of hydrogen comprises flowing a gas comprising hydrogen into the deposition chamber.

3. A method of forming a titanium layer on a substrate, the method comprising:
    placing the substrate in a sputtering chamber comprising a titanium target;
    flowing a first gas comprising hydrogen into the sputtering chamber through a first gas injector;
    terminating the flow of the first gas; and
    after the flow of the first gas has been terminated, sputter depositing the titanium layer onto the substrate by applying power to the target and by providing a second gas in the sputtering chamber through a second gas injector, wherein the hydrogen is activated and whereby the deposited titanium layer has a preferred crystal orientation.

4. The method of claim 3 wherein the first gas comprises argon and hydrogen.

5. The method of claim 4 wherein the second gas is an inert gas.

6. The method of claim 4 wherein the first gas injector is positioned proximate the target.

7. The method of claim 6 wherein the titanium target is planar and wherein flowing the first gas provides a quantity of hydrogen in the sputtering chamber that is at least $0.5 \times 10^{-4}$ standard cubic centimeters of hydrogen per square centimeter of target surface area.

8. The method of claim 3 wherein applying power to the target comprises providing a power density on the target of at least about 0.5 watt per square centimeter of target area.

9. The method of claim 8 wherein applying power to the target comprises providing a power density on the target of between about 3 and about 8 watts per square centimeter of target area.

10. A physical vapor deposition process comprising:
    placing a substrate in a physical vapor deposition chamber, said chamber comprising a titanium target;
    causing hydrogen to be absorbed into the titanium target;
    introducing an inert gas into the chamber;
    igniting a physical vapor deposition plasma in the chamber, said physical vapor deposition plasma causing the hydrogen to be released from the titanium target and to attain a concentration of at least 0.1 molar percent in the chamber, causing the hydrogen to be activated, and causing a titanium layer to be deposited onto the substrate, said titanium layer having a <0002> crystal orientation;
    depositing a titanium nitride layer on said titanium layer, said titanium nitride layer having a <111> crystal orientation; and
    depositing an aluminum layer on said titanium nitride layer.

11. The process of claim 10 wherein said aluminum layer has a <111> crystal orientation.

12. The process of claim 10 wherein said hydrogen is absorbed to a depth of about 50 Å into said titanium target.

13. The process of claim 10 wherein, after said hydrogen is released from said target, said hydrogen reacts with a species adsorbed in said substrate.

14. The process of claim 10 wherein igniting a physical deposition vapor plasma is performed after causing hydrogen to be absorbed into the titanium target.

15. The process of claim 10 comprising introducing a flow of hydrogen into the chamber prior to the ignition of the physical vapor deposition plasma.

16. The process of claim 15 comprising turning off the flow of hydrogen prior to the ignition of the physical vapor deposition plasma.

17. The process of claim 15 comprising introducing at least $0.5 \times 10^{-4}$ standard cubic centimeters of hydrogen per square centimeter of an area of the titanium target prior to the ignition of the physical vapor deposition plasma.

18. The process of claim 10 comprising causing the hydrogen in the chamber to reach a partial pressure in the range of from $3 \times 10^{-5}$ Torr to $10 \times 10^{-5}$ Torr prior to the ignition of the physical vapor deposition plasma.

19. A method of forming a titanium layer on a substrate, the method comprising:
   placing the substrate in a physical vapor deposition chamber, the chamber comprising a titanium target;
   igniting a plasma in the chamber, thereby causing a titanium layer to be deposited onto the substrate by physical vapor deposition; and
   while the plasma is active, flowing a gas comprising hydrogen into the physical vapor deposition chamber, the titanium layer thereby having a <0002> crystal orientation.

20. The method of claim 19 wherein a concentration of hydrogen in the chamber hydrogen reaches at least 0.1 molar percent during the physical vapor deposition.

21. The method of claim 19 wherein the gas comprises a mixture of argon and hydrogen.

22. The method of claim 21 wherein the gas is a molar percentage mixture of from 1% to 4% hydrogen in argon.

23. The method of claim 19 wherein flowing a gas comprising hydrogen into the physical vapor deposition chamber comprises flowing hydrogen into the chamber through a first injector, the method further comprising flowing an inert gas into the chamber through a second injector while the plasma is active.

24. The method of claim 23 wherein the inert gas is argon.

25. The method of claim 19 comprising applying power to the target at a power density of between about 3 and about 8 watts per square centimeter of target area.

* * * * *